United States Patent [19]
Mettler

[11] 3,974,941
[45] Aug. 17, 1976

[54] AUTOMATED AEROSOL MIST DISPENSER

[76] Inventor: Leo L. Mettler, 8352 W. Granite Drive, Roseville, Calif. 95678

[22] Filed: Dec. 16, 1974

[21] Appl. No.: 532,939

[52] U.S. Cl. .................................. 222/70; 222/504
[51] Int. Cl.² ..................... B67D 5/08; G04C 23/48
[58] Field of Search ............................ 222/70, 504

[56] References Cited
UNITED STATES PATENTS

| | | |
|---|---|---|
| 3,187,949 | 6/1965 | Mangel .......................... 222/504 X |
| 3,240,390 | 3/1966 | Mitchell et al. ................. 222/504 X |
| 3,351,240 | 11/1967 | Gray ..................................... 222/70 |
| 3,627,176 | 12/1971 | Sailors .................................. 222/70 |
| 3,848,775 | 11/1974 | Possell ................................. 222/70 |

*Primary Examiner*—Stanley H. Tollberg
*Assistant Examiner*—Francis J. Bartuski
*Attorney, Agent, or Firm*—Lothrop & West

[57] ABSTRACT

Short bursts of an atomized liquid, such as an air freshener, medication or insecticide, are emitted at desired intervals from a spray nozzle in communication with a conventional aerosol can containing the fluid under pressure. Interposed in the flow is a normally closed piston valve opened by electromagnetic means, the period between bursts and the burst duration being determined by RC (resistor-capacitor) circuitry.

2 Claims, 2 Drawing Figures

U.S. Patent    Aug. 17, 1976    3,974,941
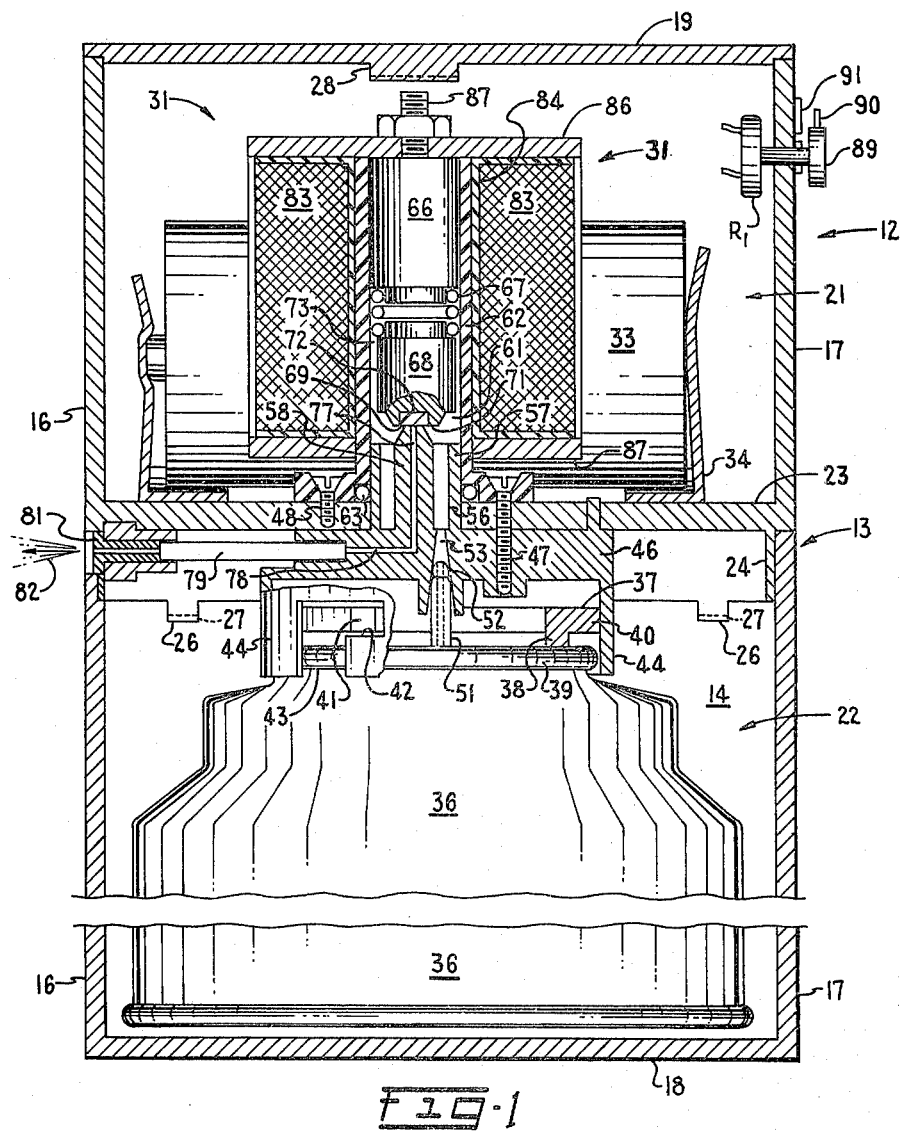

AUTOMATED AEROSOL MIST DISPENSER

The market place and the patent literature afford numerous disclosures of automatic aerosol dispensers provided with timer controls. Exemplary are Gray Pat. No. 3,351,240 dated Nov. 7, 1967 and Mangel Pat. No. 3,187,949 dated June 8, 1965. The former discloses a valve of the diaphragm type; the latter discloses a first type characterized by a fixed volume metering chamber, which limits the extent of the emission, and a second type wherein the leakproof qualities of the valve are based upon a somewhat questionable time to failure of a flexed elastomeric valve member. In sum, the prior art leaves considerable room for improvement.

It is therefore an object of the invention to provide an automated aerosol mist dispenser which affords a secure interconnection between the pressurized can of fluid and the control valve mechanism and is safe against undue leakage even at a relatively high temperature owing to the provision of a balanced piston feature.

It is another object of the invention to provide an automated aerosol mist dispenser in which the quantity of fluid emitted in any given burst is not limited to a predetermined metering chamber capacity but instead, is determined by the valves of the RC components of the electronic circuitry under the control of the user.

It is still another object of the invention to provide a generally improved automated aerosol mist dispenser.

Other objects, together with the foregoing, are attained in the embodiment described in the following description and illustrated in the accompanying drawing, in which:

FIG. 1 is a sectional view, taken generally on a median vertical plane, with some portions broken away to reveal interior details and other portions broken away to reduce the extent of the figure; and, FIG. 2 is a schematic diagram of the electronic control circuitry.

While the automated aerosol mist dispenser of the invention is susceptible of numerous physical embodiments, depending upon the environment and requirements of use, substantial numbers of the herein shown and described embodiment have been made, sold and used, and all have performed in an eminently satisfactory manner.

The dispenser of the invention, generally designated by the reference numeral 12, includes a vertically elongated housing 13 having a pair of side walls 14, a front wall 16, back wall 17, bottom 18 and top 19.

For convenience, the housing 13 is divided into an upper portion 21 and a lower portion 22, the bottom floor 23 of the upper housing portion 21 including an offset, depending flange 24 adapted to fit snugly in the top of the lower housing portion 22. Preferably, the flange 24 includes a pair of detent members 26 arranged to be snap-fitted into corresponding recesses 27 formed in opposite side walls of the lower housing 22 so as to afford a positive engagement. In somewhat comparable manner, the top closure 19 is removably mounted on the top of the upper housing 21, an interengaging snap fitting 28 being utilized.

The upper housing 21 contains the electromagnetic means 31, attendant electronic control circuitry 32 (see FIG. 2) and replaceable power supply dry cells 33 supported in metal cradles 34 adhesively secured to the nonconductive floor 23.

The lower housing 22 encloses an aerosol can 36 of conventional type provided with an adapter fitting 37 including a depending collar 38 securely engaging a ring 39 on top of the can 36. The collar 38 is surmounted by an annular flange 40 from which radially projects a plurality of locking lugs 41 adapted for engagement with the walls of a plurality of corresponding locking slots 42 laterally offset from connecting entry slots 43 formed in a drum 44 depending from a generally disc-shaped valve body 46, the valve body 46 being mounted on the bottom of the floor 23 of the upper housing 21 by fastenings 47.

The outlet of the aerosol can 36 includes an axially translatable hollow stem valve 51 which is normally closed but which opens when the stem is forcibly urged toward the can in an axial direction.

The upper end of the stem valve 51 is surmounted by a knob 52 sealingly engageable with a vertical tapered duct 53 formed in the valve body 46. The dimensions and proportions of the stem valve 51, the tapered duct 53, the locking lugs 41 and the locking slots 42 are such that when the stem knob 52 is inserted in the duct 53 and the locking lugs 41 are inserted fully in the entry slots 43 and rotated laterally into the locking slots 42, the stem valve 51 is axially urged in a forceful manner toward the aerosol can in an amount sufficient to open the stem valve 51 and allow the pressurized fluid within the can to flow through the stem 51 and through the tightly encompassed knob 52 into the tapered duct 53.

From the duct 53 the pressurized fluid emerges into an annular channel 56 defined by a cylindrical collar 57 upstanding from the valve body 46 and an axial hollow tube 58 likewise extending upwardly from the valve body 46.

The cylindrical collar 57 projects upwardly through a suitable opening in the floor 23 of the upper housing 21 and into the lower end of a cylindrical chamber 61 of an elongated sleeve 62 secured to the floor 23 and to the valve body 46 by the fastenings 47 and 48. An O-ring 63 seals the joint between the sleeve 62 and the collar 57.

The upper end of the cylindrical chamber 61 is closed off by a feromagnetic slug 66, the bottom of which is annularly recessed to receive the upper end of a compression spring 67 exerting a predetermined spring force.

The lower end of the compression spring 67 engages and serves to bias a ferromagnetic piston 68 toward a valve seat 69 on the upper end of the tube 58. Located in a boss 71 depending from the lower end of the piston 68 is a resilient insert 72 for sealing engagement with the valve seat when the piston 68 is in its normally closed position, as appears in FIG. 1.

As will be noted, the diameter of the piston 68 is less than the diameter of the encompassing cylinder walls of the chamber 61, thereby affording an annular conduit 73 for the transfer of fluid between opposite ends of the pistion 68. Consequently, the fluid pressure in the aerosol can 36, in the tapered duct 53, annular channel 56, and the chamber 61 (both above and below the piston 68) is substantially the same after sufficient time has elapsed for sufficient fluid transfer to take place to equalize the pressure at all locations.

As a result, the piston is balanced under normally closed condition, except for the spring force of the compression spring 67 urging the piston into closed position on the valve seat 69.

One of the advantages of this structure is that the piston valve 68 serves very effectively to prevent leaks even though the can 36 becomes heated, for some reason, to an undersirably elevated temperature, in excess of a temperatue on the order of 140°F, for example.

In other words, a temperature-pressure rise in the aerosol fluid within a can, if sufficiently high, creates a pressure which, in some prior art devices not having statically equalized pressures, is capable of lifting the piston off the valve seat and of thereafter holding the valve open for a measurable time, since the force exerted by the pressure on the valving end of the piston under dynamic flow conditions can substantially exceed the forces acting on the other end of the piston. In other words, once the piston opens, it tends to remain open until a considerable amount of fluid is expelled. In the case of insecticide or medication, a hazard is created.

In the present device, however, the fluid pressures on both ends of the piston 68 are balanced and it is the force of the spring 67 which holds the valve closed. Then, should the pressure within the can exceed the spring force, the elevated pressure within the can makes itself felt through the duct 53, the channel 56 and in the chamber 61 both above and below the piston 68, the annular conduit 73 serving to equalize the pressures.

Under normal operating condition, the ferromagnetic piston valve 68 is lifted from the valve seat 69 at predetermined intervals by the actuation of the electromagnetic means 31 controlled by the electronic circuitry 32 (see FIG. 2) and delivers a burst of spray for a predetermined length of time.

The electromagnetic means 31 includes a coil 83 wound on a bobbin 84 surrounding the sleeve 62, the bobbin flanges being confined vertically by a pair of pole pieces 86. The coil 83 is centered on a threaded stem 87 protruding through an opening in the top pole piece from the top of the ferromagnetic slug 66. The slug 66 is itself tightly secured to the encompassing side walls of the sleeve 62.

When the coil 83 is energized by current flow, the ferromagnetic piston 68 is magnetically driven toward the slug 66, the magnetic force being sufficient to overcome the downward urgency of the compression spring 67.

As the piston 68 separates from the valve seat 69, fluid flows from the chamber 61 through conduit 77, cross bore 78, and hose 79 to emerge from the nozzle 81 as a burst of finely divided spray 82. Concurrently, pressurized fluid from the aerosol can 36 flows through the stem 51 into the channel 56 and chamber 61 to replace the charge emitted through the spray nozzle.

The periodic actuation of the electromagnetic means 31 is initiated and controlled by the components of the electronic circuitry 32 (see FIG. 2), as previously indicated.

An on-off switch SW1 is connected to the power supply 33. When the switch SW1 is closed, capacitor C1 (470 mf) is charged through conductor 88 having interposed therein fixed resistor R2 (5.6 K ohms) and variable resistor R1 (3.5 megohm potentiometer) regulated by a knob 89 (see FIG. 1) rotatably mounted on the upper housing 21. The on-off switch SW1 is conveniently incorporated in the potentiometer R1 so that in one extreme the switch SW1 is in "Off" position.

"Fast", "Slow" and various medium settings can be established by rotating the knob 89 away from Off so that the knob arrow 90 is in register with the desired setting on the underlying indicia plate 91 on the housing. Fast is conveniently located next to Off so that when the switch SW1 is turned on, the arrow can readily be moved to "Fast". By setting the arrow on "Fast" for a short time, the unit will quickly spray five to eight times so as to clear the value of any trapped air.

"Medium" will cause the timer to actuate approximately every fifteen minutes; "Slow", every twenty five to thirty minutes. Intermediate indicia enable the user to regulate the interval to the period desired.

Depending on the setting of variable resistor R1, which establishes the off-time interval, capacitor C1 in due course becomes charged to capacity. Upon reaching that point, C1 discharges, turning on trigger transistor Q2 ( 2n2222 ) which turns on transistors Q1 ( 2n3638 ) and Q3 ( 2n2222 ). When Q3 is turned on, the R5 C2 circuit becomes energized and a charge begins to build up on C2.

Transistor Q1 is the coil driver transistor. Thus, when Q1 is turned on or "opened", the coil 83, is shunt with diode D1, is energized by current flowing from the power supply through Q1, thereby lifting the piston valve 68 off the valve seat 69 and allowing fluid to flow through the heretofore described path and out the spray nozzle 81.

The on-time, or duration of the burst, is determined by the values of capacitor C2 (50mf) and the resistor R5 (180 ohms), the on-time starting with the turning on of transistor Q3. The values of C2 and R5, in other words, determine the length of time that Q1 remains on to energize the coil 83, and thus the amount of spray is released from the pressurized valve chamber in each burst. Preferably, the term, or duration of the burst is on the order of 70 milliseconds ± 10 milliseconds. When the charge on C2 builds up to capacity, C2 discharges, turning off both Q1 and Q3, thereby deactivating the solenoid coil Q3 and allowing the spring 67 to return the armature 68 to closed position on the valve seat, thus halting fluid flow.

At this juncture, the cycle is complete and a charge again starts to build on the capacitor C1 through R1 and R2, marking the beginning of a new cycle.

What is claimed is:

1. An automated aerosol mist dispenser for use with an aerosol can having a stem valve capable of emitting pressurized fluid when open, said dispenser comprising:
   a. a housing;
   b. a sleeve mounted on said housing, said sleeve defining a cylindrical chamber having a predetermined diameter;
   c. an electromagnetically responsive piston disposed within said cylindrical chamber between one end and the other end thereof, said piston being reciprocable in said cylindrical chamber between a first position and a second position and having a passageway between the opposite ends of said piston to afford fluid communication between the respective one end and other end of said cylindrical chamber;
   d. electromagnetic means for selectively moving said piston from said first position toward said second position, said electromagnetic means including a first RC circuit capable of determining the extent of the period between energization of said electromagnetic means, and a second RC circuit capable of determining the term of each energization;

e. a valve body mounted on said housing and including a tube forming a fluid duct, said tube extending from said valve body into said one end of said cylindrical chamber toward the adjacent one end of said piston and terminating in an annular valve seat covered by the adjacent said one end of said piston in said first position of said piston and uncovered by said one end of said piston in said second position, f. a fluid inlet port in said valve body adapted to receive the stem valve of the aerosol can and to maintain said stem valve in open position, said fluid inlet port being thereby subject to a constant pressure from the pressurized fluid in said can and transferring said pressurized fluid from the can to said one end of said chamber, the pressure thus established in said one end of said chamber being transferred through said passageway to said end of said chamber to effect a pressure balance on the opposite sides of said piston;

g. a spray nozzle in communication with said fluid duct for atomizing the fluid emergent from said nozzle; and, h. spring means located in said sleeve in engagement with the other end of said piston for biasing said piston from said second position toward said first position without the assistance of fluid pressure, said electromagnetic means being capable when energized of overcoming the force of said spring means so as to move said piston from said first position toward said second position and thereby uncover said annular valve seat to permit the flow of pressurized fluid from the aerosol can through said inlet port and said one end of said chamber and from said one end of said chamber through said fluid duct to emerge as an atomized mist from said nozzel.

2. An aerosol dispenser as in claim 1 which at least one of said RC circuits includes a selectively variable resistor.

* * * * *